United States Patent
Budnaitis et al.

[11] Patent Number: 6,011,697
[45] Date of Patent: Jan. 4, 2000

[54] CONSTRAINING RING FOR USE IN ELECTRONIC PACKAGING

[75] Inventors: John J. Budnaitis; Paul J. Fischer, both of Eau Claire; David A. Hanson, Altoona; David B. Noddin, Eau Claire; Mark F. Sylvester, Eau Claire; William George Petefish, Eau Claire, all of Wis.

[73] Assignee: W. L. Gore & Associates, Inc., Newark, Del.

[21] Appl. No.: 09/195,054

[22] Filed: Nov. 18, 1998

Related U.S. Application Data

[62] Division of application No. 08/745,592, Nov. 8, 1996, Pat. No. 5,876,786.

[51] Int. Cl.[7] .............................. H05K 7/02; H05K 1/03; H05K 1/09; H05K 1/16
[52] U.S. Cl. ...................... 361/792; 361/719; 361/720; 361/761; 361/764; 361/766; 361/768; 361/771; 428/901; 257/701; 257/702; 257/706; 174/255; 174/257; 174/258; 438/118; 438/125
[58] Field of Search .................................. 361/748–751, 361/760–768, 771, 782, 783, 785, 792, 793, 795, 803, 808, 809, 811, 812, 717–720; 174/52.1–52.4, 255–260; 333/12, 246, 247; 428/901; 257/688, 689, 700–706, 723–725, 728; 438/118, 119, 121, 122, 125; 29/829, 830, 832

[56] References Cited

U.S. PATENT DOCUMENTS

| | | | |
|---|---|---|---|
| 3,265,806 | 8/1966 | Burks et al. | 257/701 |
| 3,934,074 | 1/1976 | Evelove et al. | 174/52.1 |
| 3,953,566 | 4/1976 | Gore | 264/288 |
| 4,482,516 | 11/1984 | Bowman et al. | 264/127 |
| 4,496,793 | 1/1985 | Hanson et al. | 174/68.5 |
| 4,591,659 | 5/1986 | Leibowitz | 428/901 |
| 4,598,308 | 7/1986 | James et al. | 257/707 |
| 4,705,762 | 11/1987 | Ota et al. | 501/87 |
| 4,745,457 | 5/1988 | Morgan | 257/701 |
| 4,770,922 | 9/1988 | Hatakeyama et al. | 428/327 |
| 4,806,704 | 2/1989 | Belke, Jr. et al. | 174/52.4 |
| 4,985,296 | 1/1991 | Mortimer, Jr. | 428/220 |
| 4,992,628 | 2/1991 | Beppu et al. | 257/700 |
| 4,996,097 | 2/1991 | Fischer | 428/220 |
| 5,079,069 | 1/1992 | Howard et al. | 428/209 |
| 5,103,293 | 4/1992 | Bonafino | 257/702 |
| 5,155,655 | 10/1992 | Howard et al. | 361/303 |
| 5,161,086 | 11/1992 | Howard et al. | 361/321.1 |
| 5,250,844 | 10/1993 | Smith | 257/700 |
| 5,261,153 | 11/1993 | Lucas | 29/830 |
| 5,566,448 | 10/1996 | Bhatt et al. | 29/832 |
| 5,571,608 | 11/1996 | Swamy | 428/137 |
| 5,574,314 | 11/1996 | Okada et al. | 257/703 |
| 5,753,972 | 5/1998 | Wein et al. | 257/700 |
| 5,832,598 | 11/1998 | Greenman et al. | 333/247 |

FOREIGN PATENT DOCUMENTS 2 090 072   6/1982   United Kingdom .

OTHER PUBLICATIONS

Electronics Materials and Processes Handbook, 2nd ed., C.A. Harper & R.N. Sampson, eds. pp. 1.42, 2.18–2.19 McGraw–Hill, Inc., 1994.

*Primary Examiner*—Leo P. Picard
*Assistant Examiner*—John B. Vigushin
*Attorney, Agent, or Firm*—Victor M. Genco, Jr.

[57] ABSTRACT

A constraining ring increases the modulus of an interconnect substrate to maintain flatness of the substrate. The constraining ring is made of materials selected to match the coefficient of thermal expansion of the substrate to that of the constraining ring. Circuit components including capacitors and resistors are formed on the constraining ring to provide enhanced electrical properties without adding to the size of the device.

17 Claims, 11 Drawing Sheets

CONSTRAINING RING FOR USE IN ELECTRONIC PACKAGING

RELATED APPLICATIONS

The present application is a divisional of copending U.S. patent application Ser. No. 08/745,592 filed Nov. 8, 1996, and issued Mar. 9,1999 as U.S. Pat. No. 5,876,786.

FIELD OF THE INVENTION

The present invention relates generally to integrated circuit packaging in which a laminated substrate includes organic dielectric layers, and more particularly, to a constraining ring which is incorporated into the packaging structure to maintain overall flatness, and thus, minimize bending of the packaging relative to the chip mounted on the packaging.

BACKGROUND OF THE INVENTION

Single and multiple silicon chip packages, or semiconductor chip packages, are used to provide electrical connection between semiconductor chips and other electronic components in an electronic circuit, such as die-to-package or chip-to-board interconnects. These single and multiple chip packages serve as a substrate to securely anchor electronic components and as a pathway for electrical signals.

A major shortcoming with conventional single and multiple chip packages relates to high density area array interconnect systems, with a large number of connection points for very small components. More particularly, as operating speeds increase in digital and analog systems, the size and performance of single and multiple chip packages become more and more critical. In this regard, integrated circuit densities and I/O counts are increasing rapidly, forcing packages to have higher via and wiring densities. Further, the future direction of both chip and package assembly is away from traditional peripheral chip bonds and package pins and towards area array attachment techniques.

Newer technologies, such as area array attachment techniques, are driving engineers to design chip packages that more closely match the coefficient of thermal expansion (CTE) of silicon, or otherwise ensure the reliability of such packages through thermal cycling. Embracing and, in some cases over-riding, these trends is a constant drive in the electronics industry to improve performance and simultaneously reduce cost.

Most conventional single and multiple chip packages are typically constructed from thick, mechanically robust dielectric materials, such as ceramics (e.g., alumina, aluminum nitride, beryllium oxide, cordierite, and mullite) and reinforced organic laminates (e.g., epoxies with woven glass, polyimides with woven glass, and cyanate ester with woven glass). In some cases, materials are combined to produce certain improved properties, for example, a package may have a ceramic base with one or several thin films of polyimides or benzocyclobutane (BCB) disposed thereupon.

The most common single or multiple chip electronic packages are made from injection molded plastics with metal lead frames. Sometimes, these packages include laminated interconnect structures where the dielectric layers are made from various resins, such as those used to make the commercially available "FR-4" board.

Recently, advances have been made with these laminated structures to somewhat increase density and performance, as in the case of laminated ball grid array packages. Such packages have a number of advantages over ceramic packages, such as typically lower cost, wide availability, lower dielectric constant, lower resistivity conduction paths, and lighter weight.

Unfortunately, these packages have disadvantages that offset the positive aspects of the material. These disadvantages include relatively larger via diameters, relatively low wiring densities, low via densities, high via capacitance, poor CTE match to silicon, non-flatness, large package size, poor thermal stability (glass transition $T_g \leq 140°$ C.), poor thermal conduction, and thick packages.

Some of these deficiencies have been addressed with the use of thin film polyimides and/or BCBs on ceramics. These materials have high via and wiring densities, small size, and lower dielectric constant. Despite these advantages, these materials still suffer from many shortcomings including high cost, highly resistive conduction paths, lower characteristic impedance, and processing problems leading to limited manufacturing sources and long lead times.

In an attempt to address the industry need for superior price-performance in single and multiple chip packages, packaging technologies have been developed which are based on thin dielectrics that are not reinforced with glass fibers or other mechanical aids. Examples of these thin dielectrics include thin polyimides and polytetrafluoroethylene (PTFE) based dielectrics, such as ceramic filled PTFE or cyanate ester impregnated porous PTFE. Compared with the conventional materials described hereinabove, these packaging technologies yield superior via and wiring density, extremely low dielectric constants, lower via capacitance, lower resistance, smaller package size, thinner packages, CTE matching over a wide range, lower package weight, greater thermal stability, and higher reliability than competing technologies.

In some cases, thin dielectrics are used that contain reinforcing materials such as woven glass. Notwithstanding such advantages, these technologies are impaired by very thin, fragile packages. For example, while typical ceramic packaging has a modulus of elasticity value of $40-50\times10^6$ psi, a typical modulus for a ceramic filled PTFE based package is only about 100,000 psi. Due to these constraints, packaging made from this material is very difficult to handle and assemble. Mechanical stiffeners have been used with thin packages made with these materials to give them the needed mechanical robustness.

Another area of growing interest is in providing electronic packaging that provides critical electrical performance and cost enhancements. For example, as operating frequencies increase electrical parasitic effects plague electronic systems with intermittent errors. One such parasitic effect is simultaneous switching noise. More particularly, when many transistors or transistor cells switch at once on a chip or group of chips, there is an instantaneous demand for current from the power distribution system on the chips and the packages. This high current demand may lead to voltage reduction on the power planes of the chips and packages and going less neutral on the reference planes as well as other detrimental effects. These simultaneous switching noise effects can be alleviated by substantially increasing the capacitance of the electronic package, as the stored charge in the capacitors can bolster the sagging supply voltage planes.

Typically, capacitance is added to an electronic package with discrete capacitor chips, in this regard, key areas of concern are capacitance, inductance, and cost. A preferred package will have high capacitance, low inductance, and low cost. While most common chip capacitors have fairly low cost and fairly high capacitance, they tend to have fairly high inductance. Other shortcomings of chip capacitors is the amount of space they take up on a single or multiple chip package and the time and cost to assemble a package including such a chip capacitor.

From a performance standpoint, the best capacitance is distributed capacitance, that is, capacitance that is integrated into large areas of the package. Examples of devices employing distributive capacitance are disclosed in U.S. Pat. Nos. 5,079,069; 5,155,655; 5,161,086; and 5,261,153. Distributed capacitance yields the lowest possible inductance and puts the capacitance nearly everywhere instead of at discrete points on an electronic package. This may be critical as certain parts of a chip that need de-coupling capacitance may be located too far from a discrete chip for the de-coupling to be effective. However, a shortcoming associated with existing distributed capacitance devices is that traditional approaches to distributed capacitance may give very small capacitance values in the range from tens of pico-farads/cm$^2$ to possibly a few nano-farads/cm$^2$. Unfortunately, systems designers often require tens to 100's of nano-farads/cm$^2$ of capacitance per package.

Another feature that is of interest in packaging design is the inclusion of arrays of resistors. These resistors can be used to terminate transmission lines on the package and be tied to a voltage/reference plane in a capacitor structure. Again, these functions are typically provided by installing discrete resistors to the packaging, which, of course, creates many of the shortcomings associated with the use of discrete capacitors, such as space, performance, cost, and handling limitations.

Thin film resistors, such as Titanium-Tungsten (TiW) or Tantalum Nitride, may be employed to take up less space and to provide more even performance across the electronic package. While chip resistor arrays often have tolerances of +/−15–30%, thin film resistors commonly have resistance tolerances of about +/−1–5%. In addition to tighter tolerances, thin film resistors take up less space on the package and are integrated within the electronic package. No component assembly is required thus reducing assembly cost and increasing reliability or discrete components. However, a shortcoming with integrating thin film resistors into thin laminated structures is that the brittle resistor material may be subjected to stresses that will damage them during the flexing of an electronic package. This can make the already fragile thin, laminated package material even more sensitive to stress and more easily damaged.

The foregoing illustrates limitations known to exist in present electronic packages. Thus, a continuing need exists for improved electronic packages which overcome one or more of the limitations set forth above.

SUMMARY OF THE INVENTION

An object of the present invention is to provide an improved constraining ring for use in single or multiple chip interconnect module applications, particularly flip-chip type packaging.

Another object of the present invention is to provide a constraining ring which is CTE matched to the underlying package to control flatness.

Another object of the present invention is to provide a constraining ring which includes circuit components, such as capacitors and resistors, which improve the overall performance of the package while reducing size.

Another object of the invention is to provide an improved electronic package that delivers the advantages of thin, high performance electronic packaging materials, such as PTFE composites, while maintaining the ability to be readily assembled by mass production equipment.

Yet another object of the invention is to provide an improved electronic package that can readily provide additional electronic enhancements, such as capacitance or resistance.

These and other objects of the invention are met by providing a constraining ring which includes a planar member having first and second opposite surfaces, outer peripheral edges and a central opening. The first surface being connectable to a surface of the substrate with the central opening positioned over a chip-mounting area of the substrate surface. The planar member has a coefficient of thermal expansion (CTE) that approximately matches the CTE of the substrate. The constraining ring provides mechanical support to the substrate and helps maintain the substrate flatness during chip assembly processes.

In alternate embodiments of the present invention, the constraining ring may be readily adapted to include various electrical enhancements. For instance, distributed capacitance or resistor arrays can be incorporated into the constraining ring to improve performance of the electronic package. Further, by using thin film application techniques, these improved properties can be included with minimal cost or labor.

Other objects, advantages and salient features of the invention will become apparent from the following detailed description, which, taken in conjunction with the annexed drawings, discloses preferred but non-limiting embodiments of the invention.

DETAILED DESCRIPTION OF THE INVENTION

Figure 1:
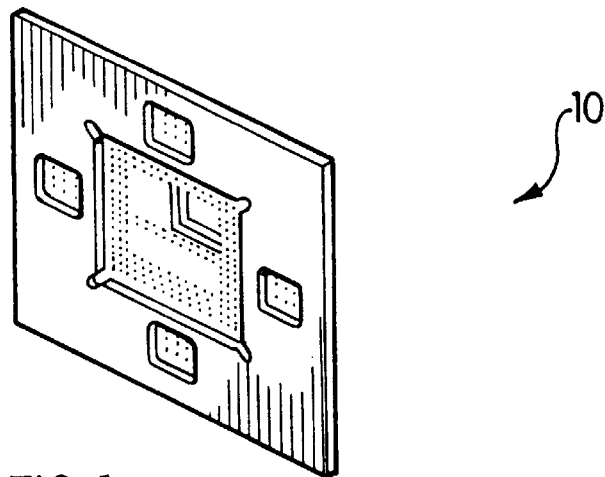
FIG. 1 is a perspective view of an improved single chip electronic package made in accordance with the teachings of one embodiment of the present invention.
Figure 2:
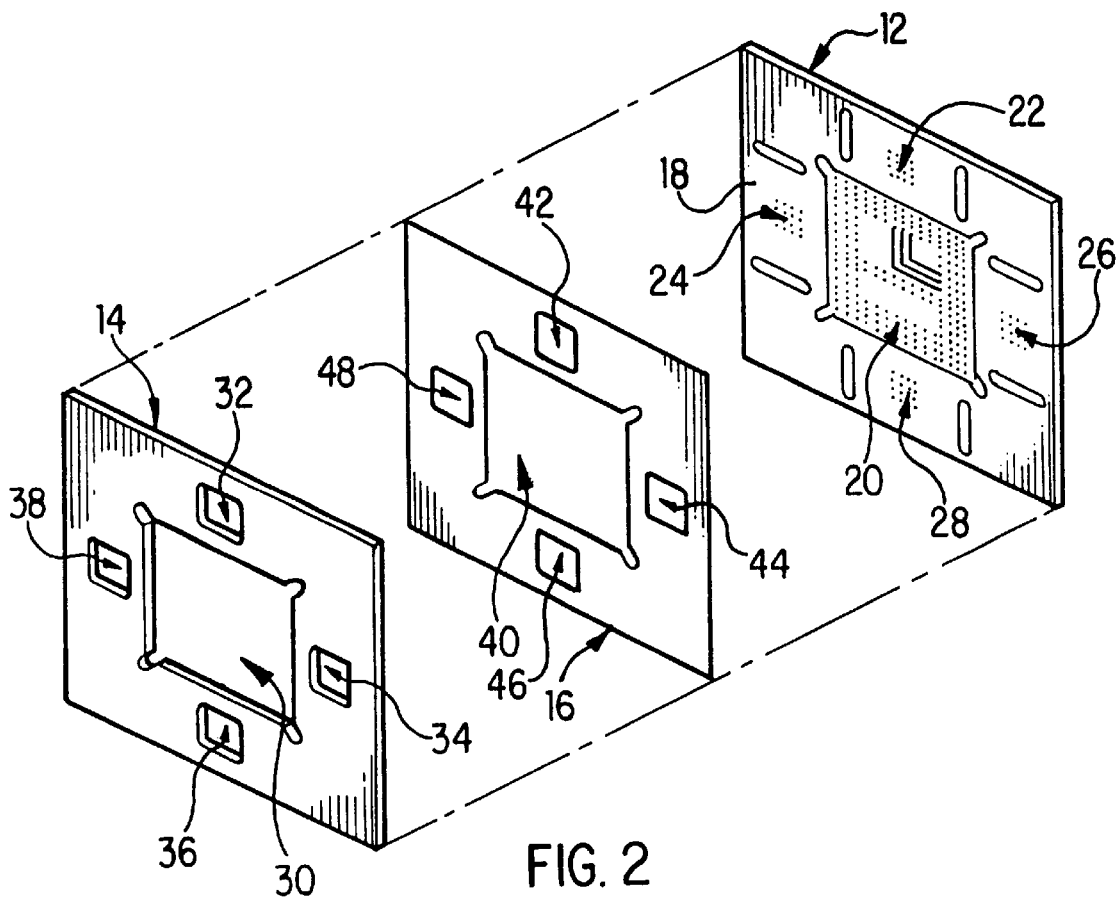
FIG. 2 is an exploded perspective view of the single chip electronic package of FIG. 1.

Referring to FIGS. 1 and 2, an integrated circuit package 10 includes a multi-ply laminated electronic interconnect substrate 12 bonded to a constraining ring 14 through an adhesive layer 16.

The substrate 12 is substantially planar and rectangular in shape, with four outer, contiguous edges. A chip-mounting surface 18 disposed on one side of the substrate has a central, rectangular chip-mounting area 20 which features a pattern of circuit connections. The chip-mounting surface 18 also has four peripheral component mounting areas 22, 24, 26, and 28 which also feature patterns of circuit connections.

The constraining ring 14 has the same general shape as the substrate 12 and has a central rectangular opening 30 which corresponds in size and position to that of the chip-mounting area 20 of the substrate 12. The restraining frame also has four peripheral rectangular openings 32, 34, 36, and 38 which correspond in size and position to that of the component mounting areas 22, 24, 26, and 28, respectively, of the substrate 12.

The adhesive layer 16 has the same overall shape as the substrate 12 and constraining ring 14, and includes a central rectangular opening 40 and four peripheral opening 42, 44, 46 and 48. When the layers are laminated together to form the package 10, the openings of the constraining ring 14 and the adhesive layer 16 are aligned with the chip and component mounting areas of the substrate 12.

The substrate 12 is preferably made of alternating conductive and dielectric layers, in which the dielectric layers are made of a polytetrafluoroethylene (PTFE) based material. A representative substrate 12 is shown in FIG. 3.

Figure 3:
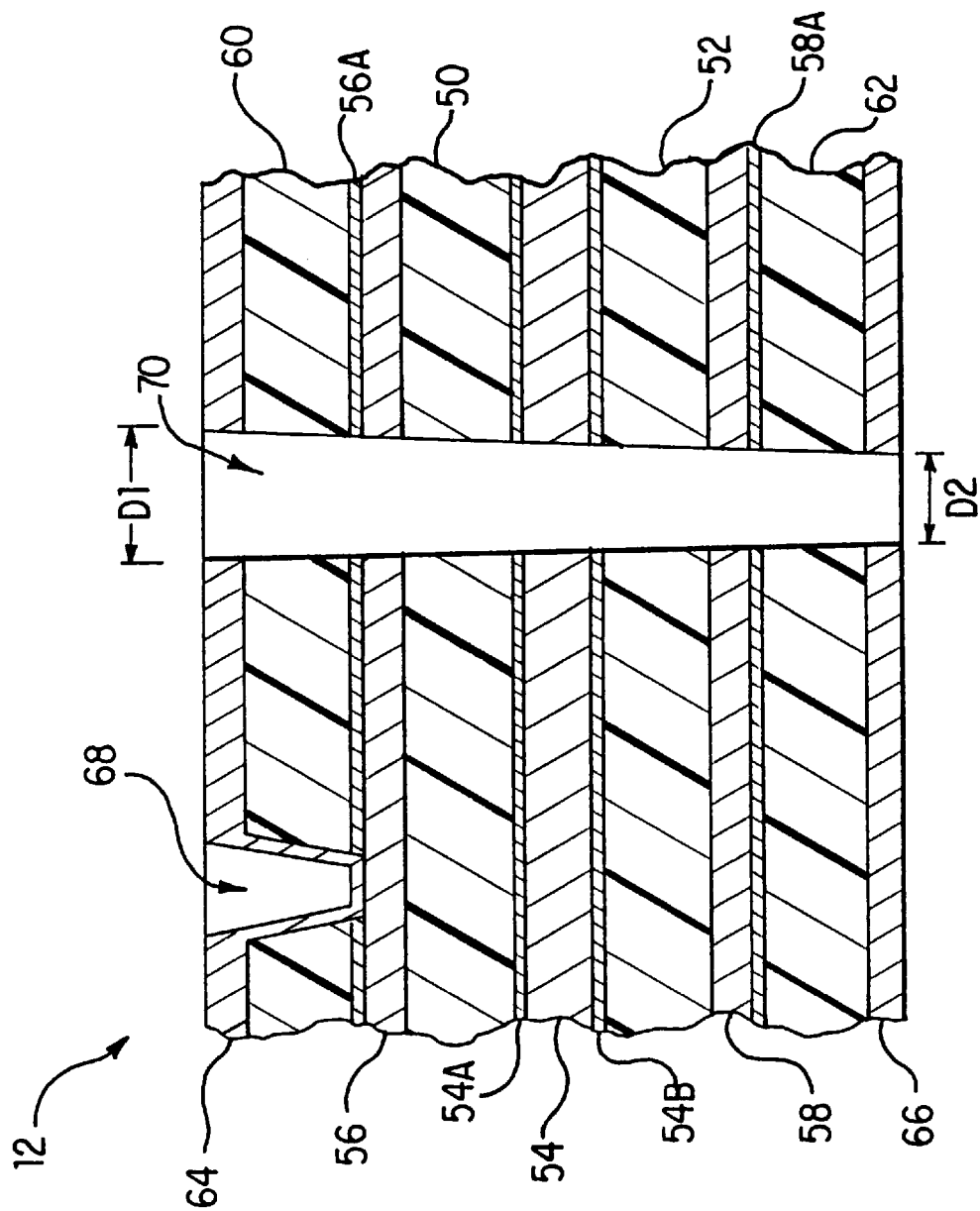
FIG. 3 is a vertical sectional view of a typical substrate used in the package of FIGS. 1 and 2.

Referring to FIG. 3, the laminated substrate 12 is constructed by serially laminating alternating layers of conductive and dielectric layers together. The various layers are positioned in a stack and then pressed together, usually with the dielectric material in a b-stage of curing so that they are not fully cured until after pressing.

The laminated substrate 12 may include any number of layers, although FIG. 3 illustrates a seven layer structure. Dielectric layers 50 and 52 are disposed on opposite sides of a core layer 54, and conductive layers 56 and 58 are disposed on the dielectric layers 50 and 52, respectively.

A dielectric layer 60 is provided on the conductive layer 56, and a dielectric layer 62 is provided on the conductive layer 58. A conductive layer 64 is provided on the dielectric layer 60 and a conductive layer 66 is provided on the dielectric layer 62.

The layers are applied serially such that at first the core layer 54, dielectric layers 50 and 52 and conductive layers 56 and 58 are pressed and bonded together. The conductive layers are patterned, and any necessary blind vias to connect conductive layers 56 and 58 are formed before the remaining layers are bonded to the structure. Subsequently, the additional dielectric layers 60 and 62 and conductive layers 64 and 66 are bonded to the other layers as shown in FIG. 3.

Alternatively, several metal/dielectric/metal laminations can be simultaneously pressed together, rather than being done in series. This type of assembly could obviate the need for a core layer, such as core layer 54 in FIG. 3. Whether done serially or simultaneously, larger or smaller numbers of laminations can be employed, although five and nine laminations have many practical applications, as does the illustrated seven ply substrate.

A blind via 68 extends through the dielectric layer 60 and a through via 70 extends through the entire laminated substrate 12. The vias 68 and 70 have entrance diameters of between 10 $\mu$m and 75 $\mu$m, inclusive. Further, the through vias have an aspect ratio, that is, the ratio of via depth to via diameter $D_1$, of between 5:1 to 25:1, inclusive.

The core layer 54 is made of a conductive material, such as a 1 oz. copper layer having a nominal thickness of 38 $\mu$m. Other well-known conductive core materials can also be used, such as aluminum. The core layer 54 provides structural support for the alternately disposed dielectric and conductive layers. Typically, the core layer 54 is electrically grounded when the laminated substrate is assembled as an interconnection circuit device in an integrated circuit package.

While the laminated substrate shown in FIG. 3 has only two dielectric layers and two conductive layers symmetrically formed on each side of core layer 54, the laminated substrate of the present invention can have any number of alternately disposed dielectric and conductive layers, whether or not a core member is used.

The dielectric layers are preferably made from laminates of high-temperature organic dielectric substrate material, such as, but not limited to, polyimides and polyimide laminates, epoxy resins, organic materials, or dielectric materials comprised at least in part of PTFE, with or without a filler. The dielectric layers have a thickness of between about 25 $\mu$m to 100 $\mu$m, inclusive. As a representative example, the dielectric layers could have a nominal thickness of about 50 $\mu$m. A more detailed description of the dielectric materials is provided hereinbelow.

The dielectric layers are laminated onto the core layer by placing the core between two sheets of dielectric material and pressing them together. When the core layer is made of copper, copper oxide layers 54a and 54b, commonly known as a brown, black or red oxide, are preferably provided on opposite surfaces of the core layer 54 for promoting adhesion of the dielectric layers 50 and 52 to the core layer 54. The copper oxide layers are formed on the core layer by using standard surface treatment techniques, such as immersing the core layer in a solution.

The conductive layers are preferably formed from a conductive material, such as copper, but other known conductive materials can be employed. The conductive layers 56 and 58 are stacked on top of the dielectric layers 50 and 52 and laminated together in the first pressing operation, in which the core 54, dielectric layers 50 and 52 and conductive layers 56 and 58 are pressed to form a laminated subassembly. In a second pressing operation, the dielectric layers 60 and 62 and conductive layers 64 and 66 are stacked and pressed to form the laminated substrate 12 shown in FIG. 3.

The conductive layers are made of a conductive material, preferably a ½ oz. copper layer having a nominal thickness of 19 $\mu$m. In the final interconnection circuit device, the conductive layers 56 and 58 are preferably signal layers, but can also be power plane layers.

When the conductive layers 56 and 58 are made of copper, copper oxide layers 56a and 58a are formed on conductive layers 56 and 58, respectively, for promoting adhesion of the dielectric layers 60 and 62 to the conductive layers 56 and 58. The copper oxide layers are formed on the conductive by using known techniques, such as immersing the substrate in a solution.

The constraining ring 14 is preferably made of a rigid material with a high modulus of elasticity. As will become evident by the following description, the ring provides desired mechanical support for high yield assembly and accomplishes many other functions as well. Examples of materials that can be used for constraining rings are metals, ceramics, reinforced laminates, glasses, silicon, and rigid plastics.

The constraining ring 14 provides numerous improvements over previous package designs. First, the constraining ring provides immediate structural support for the substrate, stiffening and reinforcing the package and protecting it from breakage or damage during handling. This improved structural integrity allows the use of sensitive materials that may be considered too susceptible to damage to be handles by mass production scale, automated assembly equipment. For instance, the constraining ring can be attached to thin, low modulus materials such as polyimides and/or PTFE composites. When constructed in this manner, the interconnect package can experience a 2 to 10 fold improvement in modulus of elasticity, with a dramatic improvement in ease in handling and resistance to damage. This can allow far easier and more practical applications for sensitive materials, such as expanded PTFE composites.

Second, the constraining ring may be constructed from selected materials that provide improved operating parameters for the package as a whole. For example, by selecting a material for the constraining ring that closely matches the coefficient of thermal expansion (CTE) of the substrate, the constraining ring will maintain the flatness of the substrate sufficiently to allow flip chip devices to be attached to the substrate .

It has been demonstrated by experiment that non-flatness may be maintained to less than 25 microns during the flip chip assembly process by the proper use of a constraining ring on a thin electronic package substrate. Some materials that have been used with success are multi-layer laminate-metal structures, metals, and injection molded organic composites. In all cases, the rings were designed to match the CTE of the substrate. In the case of the laminate-metal composite, the laminate materials used with success include fluoropolymer composites and BT-epoxy-glass. The metal used was various thicknesses of copper foil. Other metals can be used, depending on the CTE of the substrate, such as aluminum. An example of an injection molded material used with success is Ryton.

Additionally or alternatively, the constraining ring may be constructed from a thermally conductive material to assist in dissipating heat from electronic components (by way of the substrate 12). Possible suitable constraining ring materials for this application include metals, thermally conductive ceramics, or organic composites loaded with thermally conductive fillers. While simply providing a thermally conductive material alone may provide significant thermal performance, the constraining ring of the present invention may also be connected to a heat sink (see FIG. 8).

The constraining ring 14 may be mounted to the substrate in any suitable manner, including adhesive bonding (e.g., conductive or non-conductive epoxies), soldering, and fusion bonding. Preferably, for use with a fluoropolymer composite interconnect substrate comprising two to seven metal layers separated by organic dielectric layers, good success has been achieved by using a high temperature, high modulus of elasticity adhesive, such as a filled epoxy.

The constraining ring may be constructed in a wide variety of shapes and sizes without departing from the present invention. For example, the constraining ring may comprise a continuous piece with a cavity for the chip formed within it.

In the embodiment of the present invention shown in FIGS. 1 and 2, the package 10 is a high density array interconnect, such as that used for providing connection between a chip and another substrate such as a printed wiring board. As the term "high density array" is used in this application, it is intended to describe arrays of contact on center to center pitches of 2 mm or less.

To connect the package to a high density array, solder balls or similar connection means may be provided. Other suitable connection mean include standard lead frames, flex circuits, tape automated bonding (TAB), wirebond, dendritic interfaces, particle based interfaces, and elastomeric socketing materials.

In addition to improved performance in the simple construction discussed above, the constraining ring of the present invention also readily accommodates other dramatic improvements. As has been noted, there are a number of performance enhancements that are desirable in electronic packaging design. Among these are added capacitance, terminating resistors, improved thermal dissipation, and CTE matching.

Figure 4:
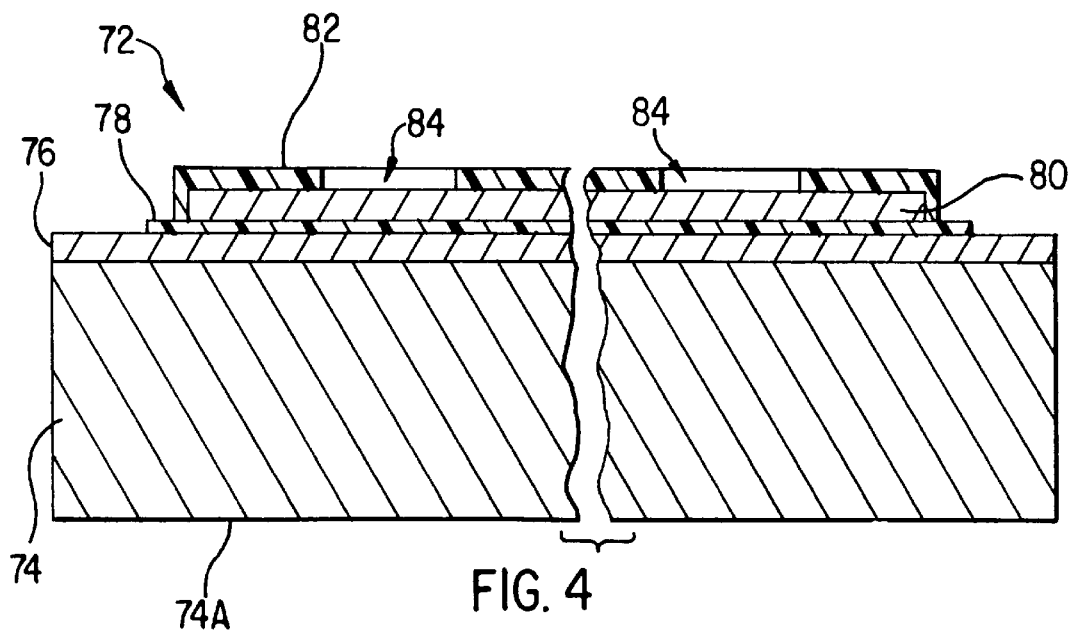
FIG. 4 is a sectional view of one embodiment of a constraining ring of the present invention incorporating a capacitor structure.

FIG. 4 illustrates a constraining ring 72 having added capacitance features. In this case the constraining ring 72 includes a high modulus substrate 74 for mechanical support and/or CTE constraint. The surface 74a of the substrate 74 is eventually bonded to a package substrate, such as the substrate 12 of FIG. 1.

The opposite surface of the substrate 74 has a metal layer 76 formed thereon, either over the entire surface or on a selected area thereof. A capacitor dielectric layer 78 is formed on the metal layer 76, and a second metal layer 80 is formed on the dielectric layer 78. A dielectric layer 82 formed on and around the metal layer 80 provides a protective overcoating. Contact openings 84 are provided where needed in the dielectric layer 82 to make electrical connection to the metal layer 80. An exposed area 86 of the metal layer 76 provides electrical connection.

It is important that the substrate 74 have a very smooth surface so that very thin dielectric films can be deposited on the surface without defects that would cause failure of the capacitor film.

The arrangement of dielectric and metal layers provides a basic parallel plate capacitor, whereby the two metal layers are the electrodes of the capacitor. Additional alternating conductive and dielectric layers can be added if necessary.

When the two electrodes are biased to different voltage levels, charges are induced at the surfaces of the dielectric adjacent to the electrodes and stored until required for use in the circuits contained in the package. When several circuits switch simultaneously, an increased demand is placed upon the package for the stored charge. The present constraining ring can supply this charge with low inductance. Electrical connection between the electrodes on the constraining ring and the interconnect can be provided by conductive adhesives, anisotropically conductive adhesives, TAB, solder, or wire bonding.

Figure 5:
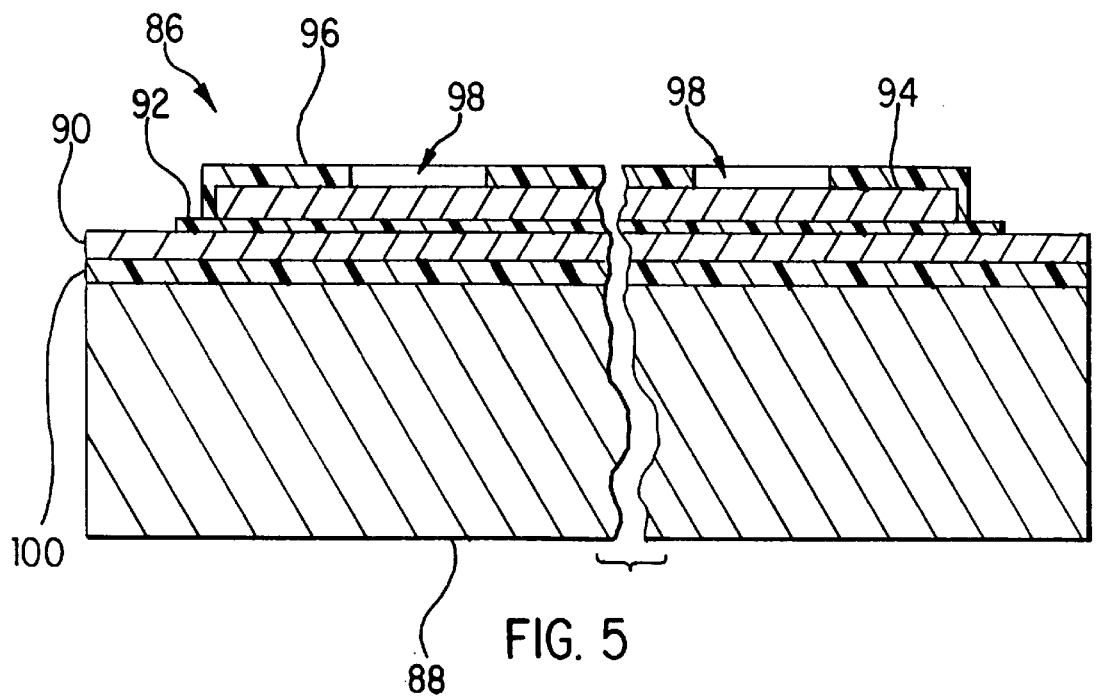
FIG. 5 is a sectional view of an alternate embodiment of the constraining ring of FIG. 4.

FIG. 5 illustrates a variation of the embodiment of FIG. 4, wherein a constraining ring 86 includes a substrate 88, a first metal layer 90, a capacitor dielectric layer 92, a second metal layer 94, and a passivation dielectric 96 having contact openings 98. In this embodiment, the constraining ring 86 includes an additional dielectric layer 100 between the substrate 88 and the first metal electrode layer 90.

The dielectric layer 100 levels and planarizes the surface of the substrate to prevent defects in the films that will be subsequently deposited. The dielectric layer 100 thus allows less expensive substrate materials with lesser quality surface finishes to be used.

As in the previous embodiment, the substrate 88 made of a high modulus material for mechanical support and/or CTE constraint.

Figure 6:
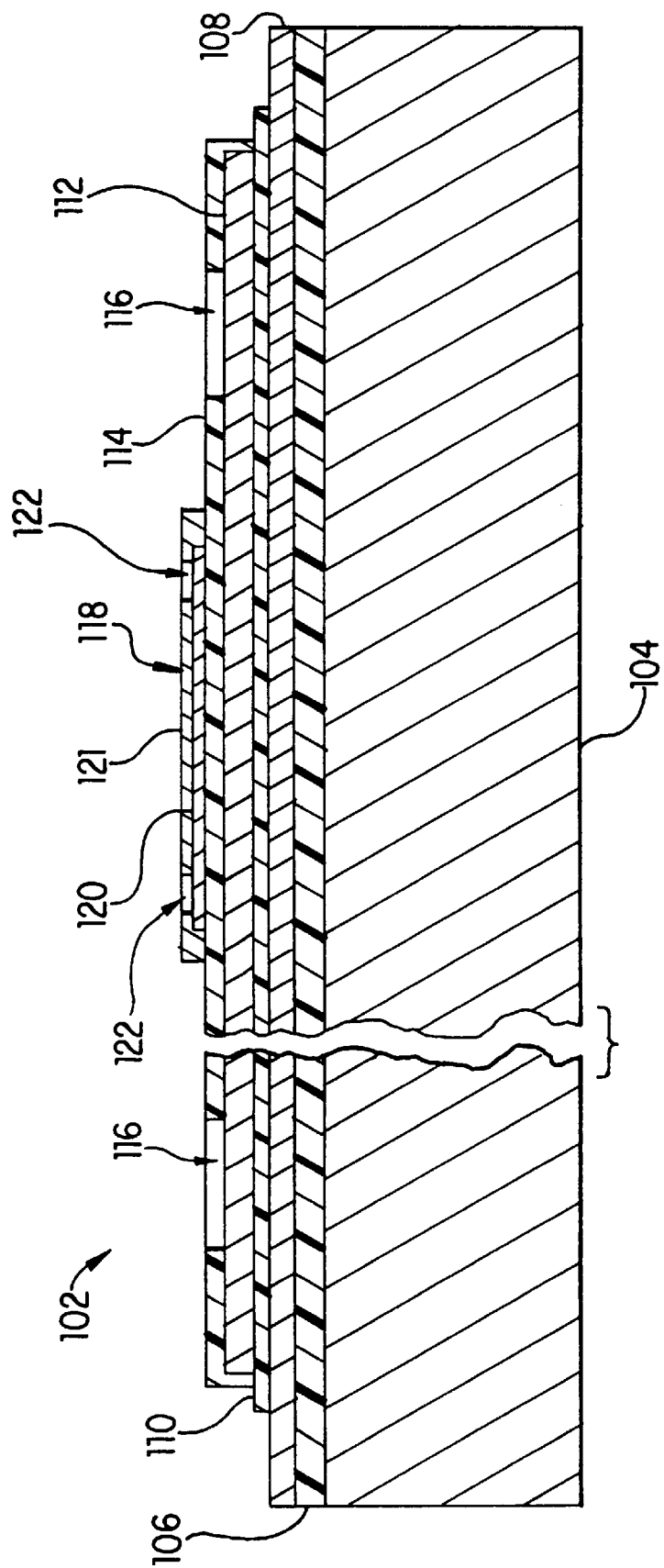
FIG. 6 is a sectional view of one embodiment of a constraining ring of the present invention incorporating a resistor structure.

FIG. 6 illustrates another embodiment of a constraining ring 102 which includes a substrate 104, a leveling dielectric layer 106, a first metal electrode layer 108, a capacitor dielectric layer 110, a second metal electric layer 112, and a passivation layer 114 with contact openings 116. As in the previous embodiments, the substrate 104 is made of a material selected to provide a high modulus for providing mechanical support and/or CTE constraint.

The embodiment of FIG. 6 includes at least one resistor 118 formed on the passivation dielectric layer 114. In particular, the resistor 118 includes a layer or strip 120 of resistive material selected to provide a desired resistance. A dielectric layer 121 covers the strip 120, and contact openings 122 permit electrical connection to the strip. Typically, these resistors are used to provide termination of signal paths. Examples of suitable resistor materials include but are not limited to Ni—Cr, Si—Ni—Cr, TaN, and TiW.

While the resistive material made be deposited as "thin films" they may also be applied as laminated foils or thicker films, depending on the particular needs of the system.

Figure 7:
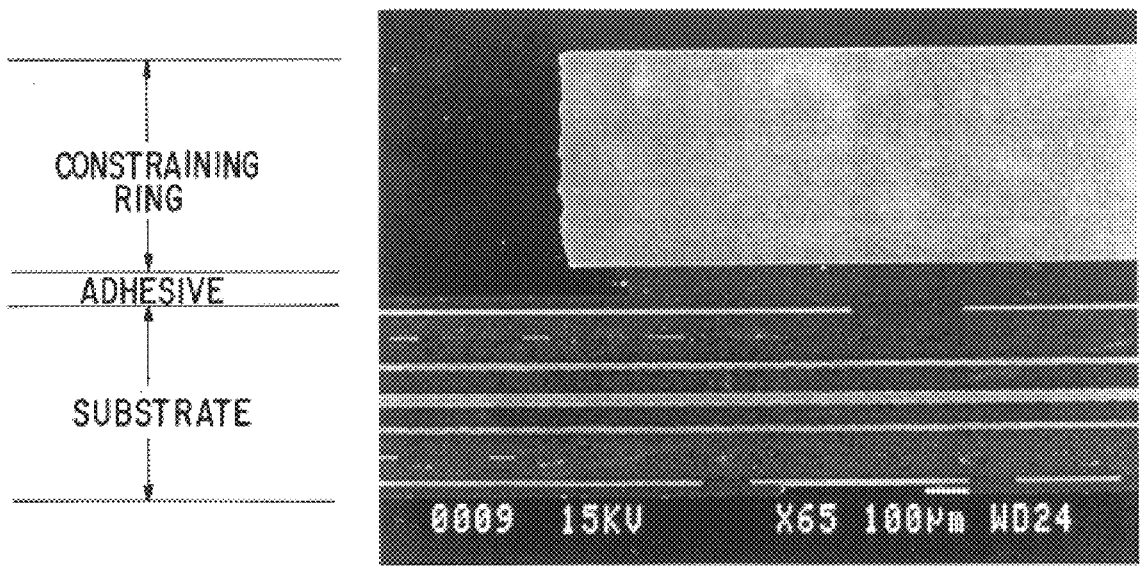
FIG. 7 is a scanning electron micrograph (SEM) image, enlarged 80 times, showing a constraining ring of the present invention attached to one face of an electronic package.

FIG. 7 is a scanning electron microscope (SEM) image showing a constraining ring attached to an interconnect structure with an adhesive. In this case, the interconnect substrate is made from layers of glass reinforced BT-epoxy resin and three layers of expanded PTFE ("ePTFE") impregnated with cyanate ester and epoxy. There are six metal layers, two for signal redistribution, two for voltage planes and two for the outer pad layers. Total thickness of the substrate is approximately 0.400 mm, thickness for the adhesive is approximately 0.125 mm, and the constraining ring is approximately 0.550 mm thick. The ring material is copper in this case. The ring adhesive material is a silver filled, glass reinforced epoxy film.

Figure 8:
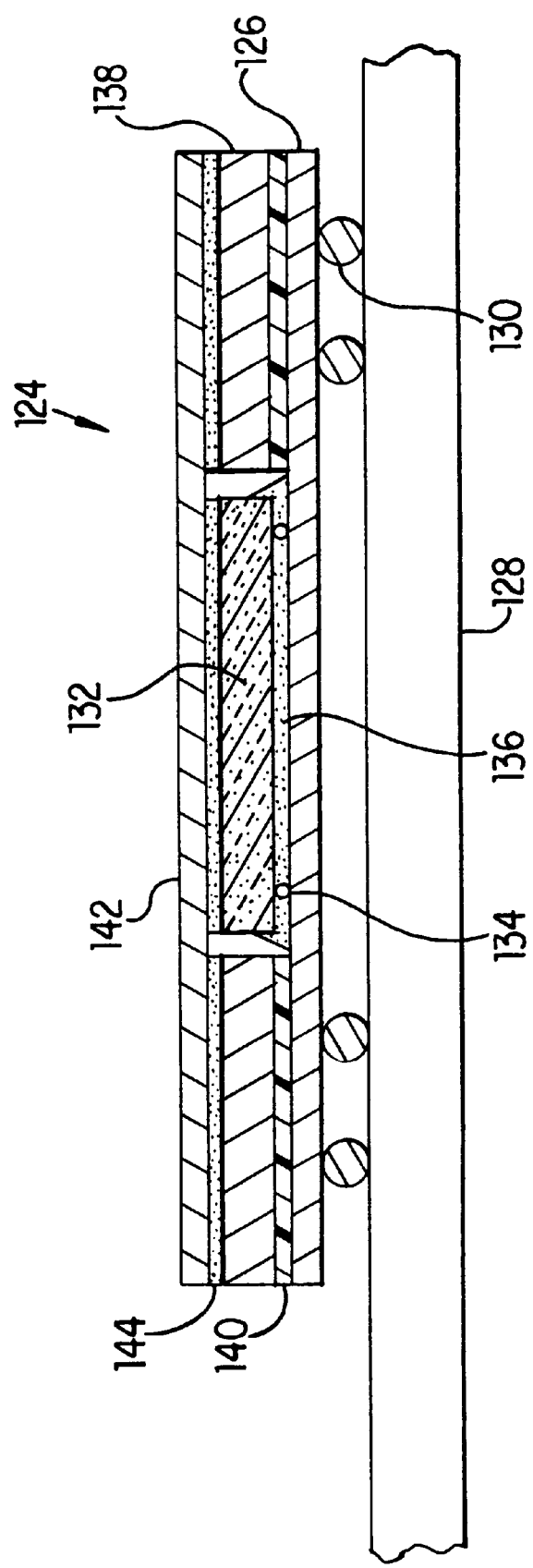
FIG. 8 is a sectional view of a laminated interconnect of the present invention including a heat spreader.

The constraining ring of the present invention is particularly well suited for a flip-chip package 124 as seen in FIG. 8. The package 124 includes a laminated substrate 126 as the interconnect device. The substrate is mechanically and electrically attached to a printed wiring board (PWB) 128 through an array of solder ball connections 130. This may be a full array or it may be de-populated in the area under the semiconductor device or chip 132.

The chip 132 is mechanically and electrically attached to the substrate 126 through an array, full or depopulated, of solder ball connections 134. The chip 132 is additionally adhered to the substrate through an underfill adhesive 136. The adhesive 136 is typically a filled epoxy that is dispensed and thermally cured.

The substrate 126 is made of materials that nearly match the CTE of the PWB 128. To ensure flatness and mechanical strength, a constraining ring 138 is attached to the substrate 126 with an adhesive layer 140. The constraining ring 138 and the adhesive layer 140 have been described in greater detail with respect to FIGS. 1 and 2. A lid 142 is optionally bonded to the constraining ring 138 by an adhesive 144 to provide protection and act as a heat sink.

As seen in FIG. 8, the area underneath the chip 132 and juxtaposed the substrate 126 is the area that must be maintained with very low non-flatness during assembly so that the solder balls 134 associated with the chip 132 correctly reflow to the substrate 126. The constraining ring 138 promotes thermal spreading from the lid 142, particularly when the lid attach adhesive 144 exhibits relatively high thermal conductivity.

Figure 9:
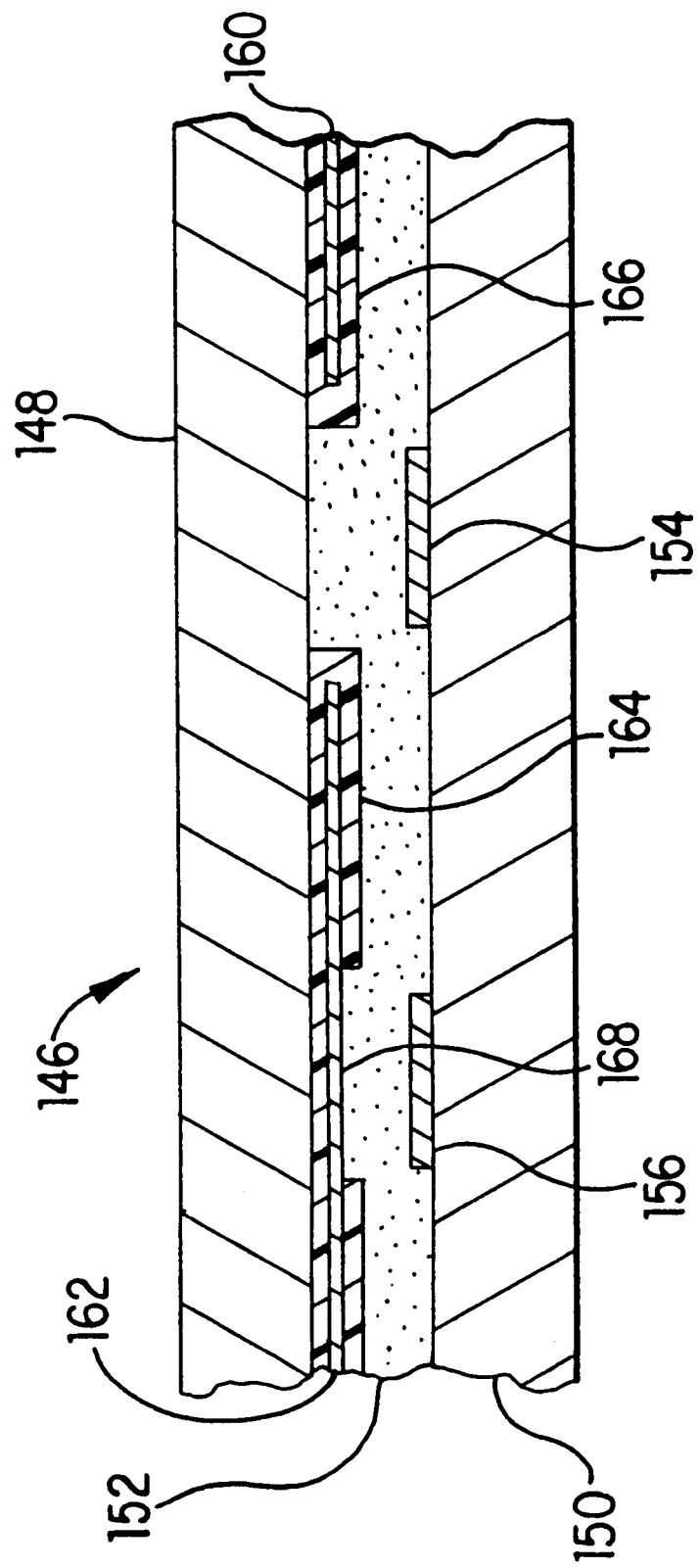
FIG. 9 is a sectional view of a constraining ring of the present invention which is shown attached physically and electrically to an electrical interconnect with an anisotropically conductive adhesive.

FIG. 9 is a sectional view of a package 146 which includes a constraining ring 148 attached to a substrate 150 by an anisotropic conductive layer 152. Pads 154 and 156 formed on the surface of the substrate provide a first electrode of a capacitor. Second electrodes 160 and 162 are attached to the inner surface of the constraining ring 148 through dielectric layers 164 and 166, respectively.

The anisotropic conductive adhesive layer 152 provides electrical conductivity only in desired areas. In this case, the conductivity is provided between the electrode openings on the ring 148 and the pads 156 and 158 on the substrate 150. Thus, the anisotropic adhesive permits current flow in the vertical direction but not in the horizontal direction.

Figure 10:
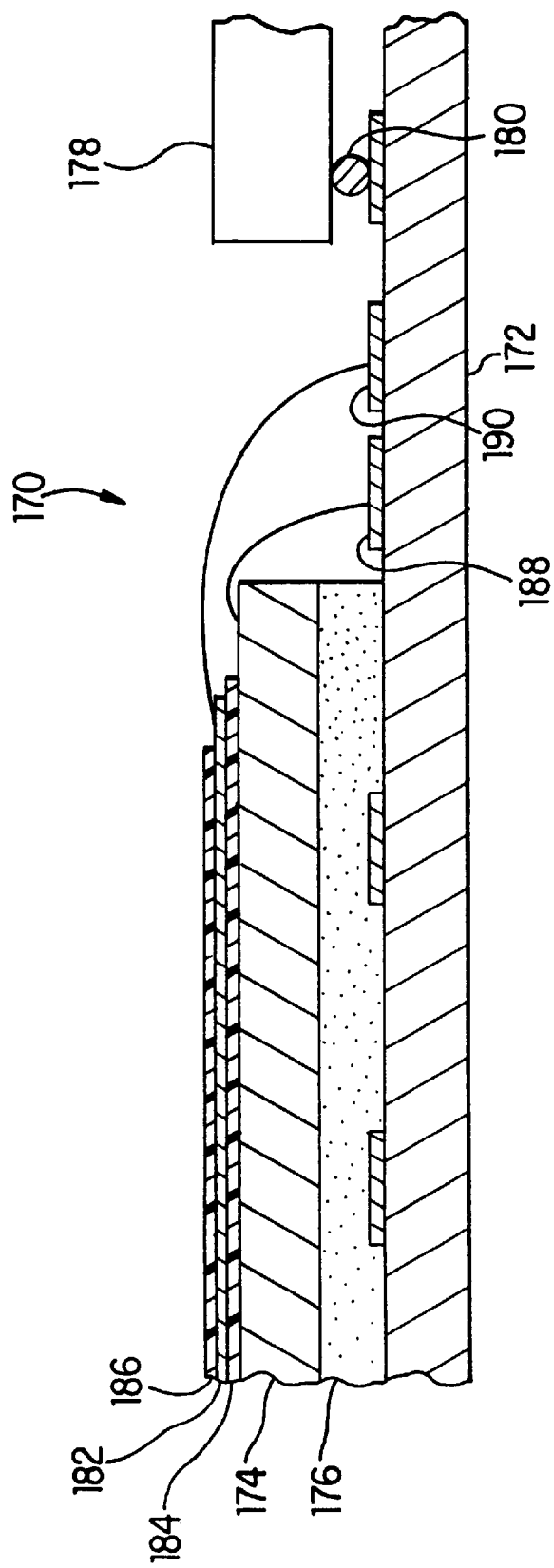
FIG. 10 is a sectional view of a constraining ring of the present invention which is shown attached physically to an electrical interconnect with an adhesive and electrically attached with wire bonds.

In the embodiment of FIG. 10, a package 170 includes a substrate 172 having a constraining ring 174 bonded thereto through an adhesive layer 176. A chip 178 is coupled to the substrate through solder ball connections 180. A conductive layer 182, disposed on the constraining ring 174 between two dielectric layers 184 and 186, acts as a first electrode of the capacitor. The constraining ring 174 acts as the second electrode of the capacitor. Each electrode is connected by wire bonds to contact pads 188 and 190 of the substrate 172. In this embodiment the adhesive used in layer 176 is non-conductive.

Figure 11:
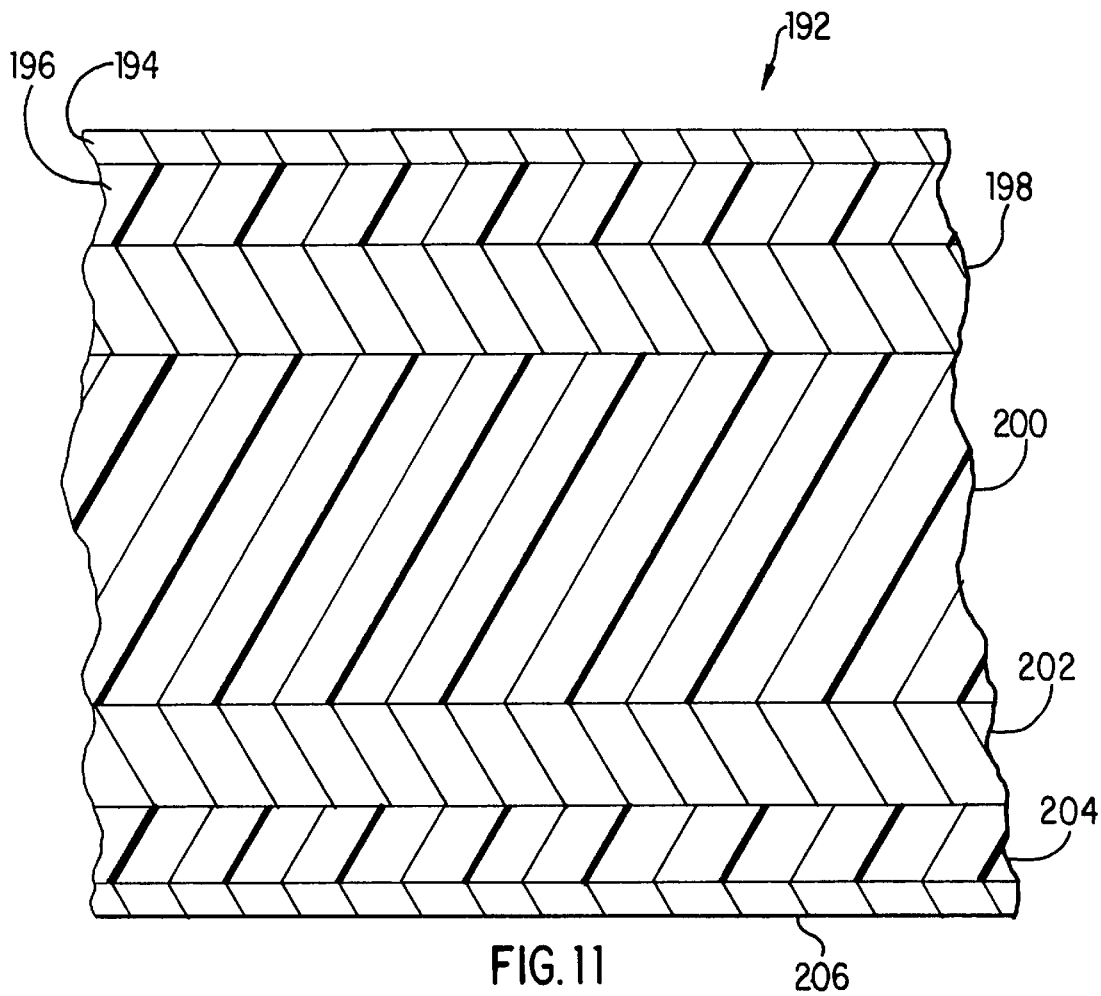
FIG. 11 is a sectional view of a constraining ring of the present invention, showing a multi-layered construction.

A preferred constraining ring 192 is shown in FIG. 11. The ring 192 is a multi-layered laminated structure having an outer, first conductive layer 194, a first dielectric layer 196, a second conductive layer 198, a second dielectric layer 200, a third conductive layer 202, a third dielectric layer 204 and a fourth conductive layer 206. The structure illustrated in FIG. 11 uses specific materials that collectively yield a CTE for the constraining ring 192 which matches that of laminated package substrates such as the one illustrated in FIG. 3.

The conductive layers are preferably made of copper while the dielectric layers are made of an expanded PTFE (ePTFE) impregnated with cyanate ester and epoxy. This is the same material that is preferably used in the dielectric layers of the substrate. A more detailed description of the dielectric material follows.

The first conductive layer 194 is approximately 18 $\mu$m thick. The successive layers are 70 $\mu$m, 560 $\mu$m, 70 $\mu$m, 44 $\mu$m, and 18 $\mu$m. Thus, the outer-most conductive layers have the same dimension, as do the inner conductive layers 198 and 202. Also the dielectric layers 196 and 204 have the same dimension.

Figure 12:
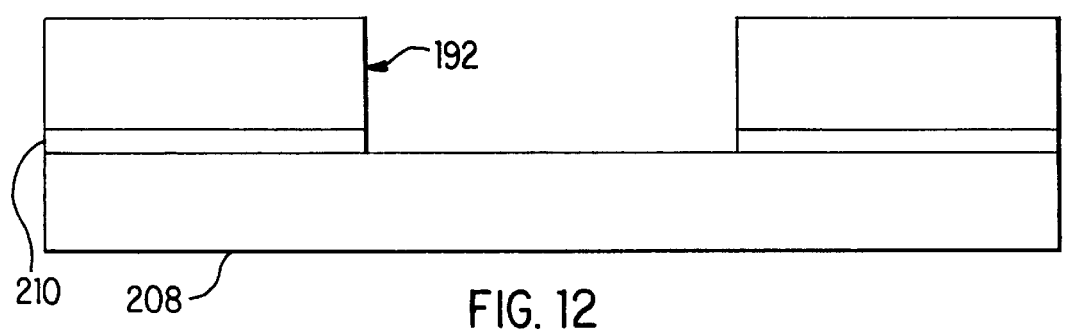
FIG. 12 is a schematic view showing dimensions of a restraining ring according to the present invention.

As seen in FIG. 12, the constraining ring 192 has a length and width of 33 mm +/−0.100 mm, which is the same as the underlying substrate 208. The thickness of the constraining ring is 0.787 mm +/−0.075 mm. The substrate has a thickness of 0.420 mm +/−0.060 mm. The adhesive layer 210 has a thickness of 0.100 mm +/−0.015 mm.

The constraining rings described above aid in assembly of integrated circuits to organic substrates by ensuring that the substrates remain flat during assembly processes. For area array chip attach technologies such as the "C4" process described by IBM, the non-flatness of the substrate must be maintained at a level of less than 25 microns per 25.4 mm. With chip sizes for area array attachment approaching 30 mm along an edge, the flatness requirement has moved significantly beyond what is achievable by most organic substrate technologies. Most described organic substrate technologies are only able to achieve nonflatness values of 75 microns over a 20 mm distance.

Flatness is very difficult to achieve and maintain where substantial differences in CTE are present between the various components of the assembly. For example, for packages using organic materials for the dielectric layers, as the density of interconnection on semiconductor devices increases, the solder connections between the interconnect device and the PWB tend to fail due to CTE mismatch.

Seemingly slight geometric features can have a significant impact on the CTE differential between components. For example, a relative thickness of an interconnection circuit device of between 5 mils to 20 mils, inclusive, causes the device to be adversely affected by the difference between the CTE of the PWB and the CTE of the chip 132. Typically, the CTE of a flip-chip PWB varies between 17 to 25 ppm, while the CTE of an integrated circuit chip is 3 ppm.

The CTE of the interconnection circuit device is dominated by the dielectric substrate material forming the device. When the interconnection circuit device is attached to the chip, both the device and the chip are heated during solder reflow to typically above 180° C. Depending upon the dielectric material used for the interconnection circuit device, the dielectric material can be heated above the glass transition temperature $T_g$ of the dielectric material, causing the CTE of the dielectric material to change by as much as three times the initial CTE of the dielectric material. Thus, selecting a dielectric material with a relatively high $T_g$, such as 200° C. or greater, is desirable.

In order to achieve the necessary flatness for area array chip attach and maintain that flatness throughout the assembly processes, it has been determined by experimentation that a constraining ring of less than 1.27 mm in thickness must have a CTE that matches the CTE of the substrate it is being attached to within +/−20% when that substrate has a CTE in the range of 14–35 ppm/°C. and flexural and tensile moduli of less than or equal to 50 GPa.

The die area of several sample substrates were tested to measure die area flatness using the constraining ring of the present invention. When using the multi-layered laminated constraining ring of FIG. 11, the die area flatness was measured for twenty-eight sample substrates. The average flatness for the samples was 0.0077 mm.

Dielectric Materials

Any suitable dielectric material can be used in the present invention for making the dielectric layers of either the substrate or the constraining ring. These materials include, but are not limited to, polyimides and polyimide laminates, epoxy resins, epoxy resins in combination with other resin material, organic materials, alone or any of the above combined with fillers.

Preferred dielectric materials include a fluoropolymer matrix, where the fluoropolymer can be PTFE, expanded polytetrafluoroethylene (ePTFE) or copolymers or blends. Suitable fluoropolymers include, but are not limited to, polytetrafluoroethylene or expanded polytetrafluoroethylene, with or without an adhesive filler mixture.

Figure 13:
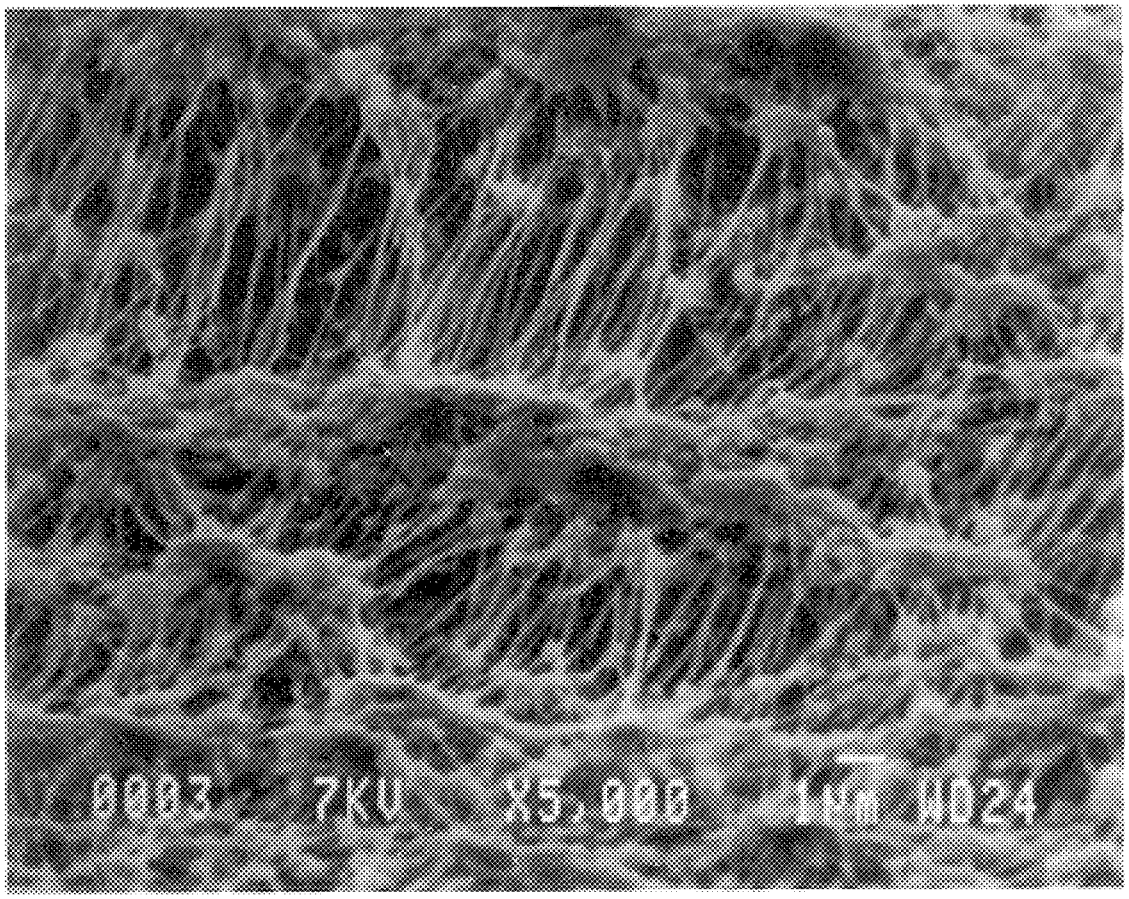
FIG. 13 is a SEM image of a preferred dielectric material used in the present invention in which an ePTFE matrix is impregnated with cyanate ester and epoxy.
Figure 14:
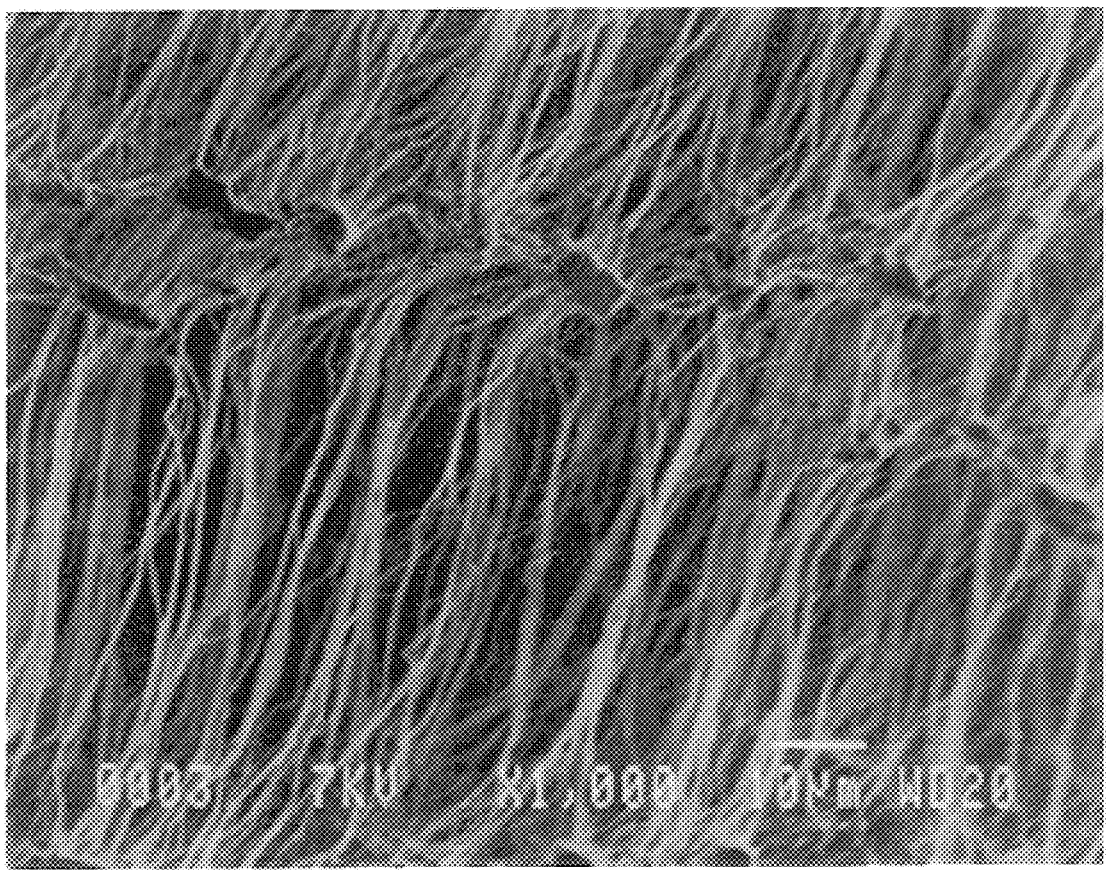
FIG. 14 is a SEM image of another preferred dielectric material in which a ceramic filler is added to the matrix.

Preferred materials include Speedboard® bond plies available from W. L. Gore and Associates, Inc., such as, Speedboard® C which is a prepreg of non-woven material containing a cyanate ester resin in a polytetrafluoroethylene matrix. Speedboard® C has a dielectric constant, (Dk) of 2.6–2.7 at 1 MHz–10 GHz, a loss tangent of 0.004 at 1 MHz–10 GHz, a dielectric strength greater than 1000 V/mil, a glass transition ($T_g$) of 220° C., a resin content of 66–68 wt. % and is available in a variety of thicknesses. Also Speedboard® N prepreg, which is a prepreg of a non-woven material containing a multi-functional epoxy adhesive, in an expanded PTFE matrix may also be used. Speedboard® N has a dielectric constant, (Dk) of 3.0 at 1 MHz, a loss tangent of 0.02 at 1 MHz, a dielectric strength greater than 900 V/mil, a glass transition ($T_g$) of 140° C., a resin content of 66–68 wt. % and is available in a variety of thicknesses. Another suitable dielectric is an expanded PTFE matrix, shown in FIG. 13, that includes a mixture of at least two of a cyanate ester compound, an epoxy compound, a bistriazine compound and a poly (bismaleimide) resin. For example, a varnish solution is made by mixing 5.95 pounds of M-30 (Ciba Geigy), 4.07 pounds of RSL 1462 (Shell Resins, Inc.), 4.57 pounds of 2, 4, 6-tribromophenyl-terminated tetrabromobisphenol A carbonate oligomer (BC-58) (Great Lakes Inc.), 136 g bisphenol A (Aldrich Company), 23.4 g Irganox 1010, 18.1 g of a 10% solution of Mn HEX-CEM in mineral spirits, and 8.40 kg MEK. The varnish solution was further diluted into two separate baths—20% (w/w) and 53.8% (w/w). The two varnish solutions were poured into separate impregnation baths, and an e-PTFE web was successively passed through each impregnation bath one immediately after the other. The varnish was constantly agitated so as to insure uniformity. The impregnated web was then immediately passed through a heated oven to remove all or nearly all the solvent and partially cure the adhesives, and was collected on a roll. The ePTFE web any be any desired thickness, such as 25 $\mu$m 40 $\mu$m, for example. A 25 $\mu$m thick material has a mass of approximately 0.9 g and a weight per area of approximately 11.2 to 13.8 g/m$^2$ Other classes of dielectric materials include those where a porous matrix system contains an imbibed or impregnated adhesive-filler mixture. The porous matrix is a non-woven substrate that is imbibed with high quantities of filler and a thermoplastic or thermoset adhesive, as a result of the initial void volume of the substrate, heated to partially cure the adhesive and form a B-stage composite. Substrates include fluoropolymers, such as the porous expanded polytetrafluoroethylene material of U.S. Pat. Nos. 3,953,566 and 4,482,516, each of which is incorporated herein by reference. Desirably, the mean flow pore size (MFPS) should be between about 2 to 5 times or above that of the largest particulate, with an MFPS of greater than about 2.4 times that of the filler being particularly preferred. However, it is also within the scope of the invention that suitable composites can be prepared by selecting the ratio of the mean flow pore size to average particle size to be greater than 1.4. Acceptable composites can also be prepared when the ratio of the minimum pore size to average particle size is at least above 0.8, or the ratio of the minimum pore size to the maximum particle size is at least above 0.4. Such ratio may be determined with a Microtrak® Model FRA Particle Analyzer device.

Alternatively, another mechanism for gauging relative pore and particle sizes may be calculated as the smallest pore size being not less than about 1.4 times the largest particle size.

In addition to expanded fluoropolymer substrates, porous expanded polyolefins, such as ultra high molecular weight (UHMW) polyethylene, expanded polypropylene, polytetrafluoroethylene made by paste extrusion and incorporating sacrificial fillers, porous inorganic or organic foams, or microporous cellulose acetate, can also be used.

The porous substrate has an initial void volume of at least 30%, preferably at least 50%, and most preferably at least 70%, and facilitates the impregnation of thermoset or thermoplastic adhesive resin and particulate filler paste in the voids while providing a flexible reinforcement to prevent brittleness of the overall composite and settling of the particles.

The filler comprises a collection of particles when analyzed by a Microtrak® Model FRA Particle Analyzer device, which displays a maximum particle size, a minimum particle size and an average particle size by way of a histogram.

Suitable fillers to be incorporated into the adhesive include, but are not limited to, $BaTiO_3$, $SiO_2$, $Al_2O_3$, ZnO, $ZrO_2$, $TiO_2$, precipitated and sol-gel ceramics, such as silica, titania and alumina, non-conductive carbon (carbon black) and mixtures thereof. Especially preferred fillers are $SiO_2$, $ZrO_2$, $TiO_2$ alone or in combination with non-conductive carbon. Most preferred fillers include filler made by the vapor metal combustion process taught in U.S. Pat. No. 4,705,762, such as, but not limited to silicon, titanium and aluminum to produced silica, titania, and alumina particles that are solid in nature, i.e., not a hollow sphere, with a uniform surface curvature and a high degree of sphericity.

The fillers may be treated by well-known techniques that render the filler hydrophobic by silylating agents and/or agents reactive to the adhesive matrix, such as by using coupling agents, Suitable coupling agents include, silanes, titanates, zirconates, and aluminates. Suitable silylating agents may include, but are not limited to, functional silyating agents, silazanes, silanols, siloxanes.

Suitable silazanes, include, but are not limited to, hexamethyldisilazane (Huls H730) and hexamethylcyclotrisilazane, silylamides such as, bis (trimethylsilyl)acetamide (Huls B2500), silylureas such as trimethylsilylurea, and silylmidazoles such as trimethylsilylimidazole.

Titanate coupling agents are exemplified by the tetra alkyl type, monoalkoxy type, coordinate type, chelate type, quaternary salt type, neoalkoxy type, cycloheteroatom type. Preferred titanates include, tetra alkyl titanates, Tyzor® TOT {tetrakis(2-ethyl-hexyl) titanate, Tyzor® TPT {tetraisopropyl titanate}, chelated titanates, Tyzor® GBA {titanium acetylacetylacetonate}, Tyzor® DC {titanium ethylacetacetonate}, Tyzor® CLA {proprietary to DuPont}, Monoalkoxy (Ken-React® KR TTS), Ken-React®, KR-55 tetra (2,2 diallyloxymethyl)butyl, di(ditridecyl)phosphito titanate, LICA® 38 neopentyl(diallyl)oxy, tri(dioctyl)pyrophosphato titanate.

Suitable zirconates include, any of the zirconates detailed at page 22 in the Kenrich catalog, in particular KZ 55-tetra (2,2 diallyloxymethyl)butyl, di(ditridecyl)phosphito zirconate, NZ-01-neopentyl(diallyl)oxy, trineodecanoyl zirconate, NZ-09-neopentyl(diallyl)oxy, tri(dodecyl)benzene-sulfonyl zirconate.

The aluminates that can be used in the present invention include, but are not limited to Kenrich®, diisobutyl(oleyl) acetoacetylaluminate (KA 301), diisopropyl(oleyl) acetoacetyl aluminate (KA 322) and KA 489.

In addition to the above, certain polymers, such as, cross-linked vinylic polymers, e.g., divinylbenzene, divinyl pyridine or a sizing of any of the disclosed thermosetting matrix adhesives that are first applied at very high dilution (0.1 up to 1.0% solution in MEK) can be used. Also, certain organic peroxides, such as, dicumylperoxide can be reacted with the fillers.

The adhesive itself may be a thermoset or thermoplastic and can include polyglycidyl ether, polycyanurate, polyisocyanate, bis-triazine resins, poly (bis-maleimide), norbornene-terminated polyimide, polynorbornene, acetylene-terminated polyimide, polybutadiene and functionalized copolymers thereof, cyclic olefinic polycyclobutene, polysiloxanes, poly sisqualoxane, functionalized polyphenylene ether, polyacrylate, novolak polymers and copolymers, fluoropolymers and copolymers, melamine polymers and copolymers, poly(bis phenycyclobutane), and blends or prepolymers thereof. It should be understood that the aforementioned adhesives may themselves be blended together or blended with other polymers or additives, so as to impact flame retardancy or enhanced toughness.

As used herein, mean flow pore size and minimum pore size were determined using the Coulter® Porometer II (Coulter Electronics Ltd., Luton UK) which reports the value directly. Average particle size and largest particle size were determined using a Microtrak® light scattering particle size analyzer Model No. FRA (Microtrak Division of Leeds & Northup, North Wales, Pa., USA). The average particle size (APS) is defined as the value at which 50% of the particles are larger. The largest particle size (LPS) is defined as the largest detectable particle on a Microtrak® histogram. Alternatively, the largest particle size is defined at the minimum point when the Microtrak® Model FRA Particle Analyzer device determines that 100% of the particulate have passed.

In general, the method for preparing the adhesive-filler dielectric involves:(a) expanding a polytetrafluoroethylene sheet by stretching a lubricated extruded perform to a microstructure sufficient to allow small particles and adhesives to free flow into the void or pore volume; (b) forming a paste from polymeric, e.g., thermoset or thermoplastic material and a filler; and (c) imbibing by dipping, coating, or pressure feeding, the adhesive-filler paste into the highly porous scaffold, such as expanded polytetrafluoroethylene.

Table 1 shows the effect of the relationship of the substrate mean flow pore size (MFPS) and particulate size. When the ratio of the mean flow pore size (MFPS) to largest particulate is 1.4 or less, poor results are observed. In this case, a homogeneous composite is not observed, and most of the particulate filler does not uniformly penetrate the microporous substrate. When the ratio of the MFPS to largest particulate is greater than about 2.0, then a uniform composite is obtained. It is also observed that the larger the ratio of MFPS to largest particulate, the greater the relative case it is to imbibe a homogeneous dispersion into the microporous substrate.

TABLE 1

| Desc. | Substrate Pore Size Min (μm) | Substrate Pore Size MFPS (μm) | Particle Size Avg (μm) | Particle Size Max (μm) | MFPS ÷ Part$_{Avg}$ | Pore$_{Min}$ ÷ Part$_{Max}$ | Pore$_{Min}$ ÷ Part$_{Avg}$ | Result |
|---|---|---|---|---|---|---|---|---|
| A | 4 | 7 | 5 | 10 | 1.4 | 0.4 | 0.8 | Poor |
| B | 4 | 5 | 5 | 10 | 1.0 | 0.4 | 0.8 | Poor |
| C | — | 58 | 5 | 10 | 12.4 | N/A | — | Good |
| D | 18 | 32 | 6 | 10 | 5.3 | 1.8 | 3.0 | Good |
| E | 18 | 32 | 1 | 1 | 32.0 | 18.0 | 18 | Good |
| F | 17 | 24 | 6 | 10 | 4.0 | 1.7 | 2.8 | Good |
| G | 0.2 | 0.4 | 0.5 | 1.6 | 0.8 | 0.125 | 0.4 | Poor |
| H | — | 60 | 18 | 30 | 3.3 | — | — | Good |
| I | 14 | 11 | 0.5 | 1.6 | 22.0 | 8.8 | 28 | Good |
| J | 14 | 29 | 4 | 8 | 7.3 | 1.8 | 3.5 | Good |
| K | 14 | 29 | 5 | 10 | 5.8 | 1.4 | 2.8 | Good |

EXAMPLE 1

A fine dispersion was prepared by mixing 281.6 g TiO$_2$ (TI Pure R-900, Du Pont Company) into a 20% (w/w) solution of a flame retarded dicyanamide/2-methylimidazole catalyzed bisphenol-A based polyglycidyl ether (Nelco N-4002-5, Nelco Corp.) in MEK. The dispersion was constantly agitated so as to insure uniformity. A swatch of expanded PTFE was then dipped into the resin mixture. The web was dried at 165° C. for 1 min. under tension to afford a flexible composite. The partially-cured adhesive composite thus produced comprised of 57 weight percent TiO$_2$, 13 weight percent PTFE and 30 weight percent epoxy adhesive. Several plies of the adhesive sheet were laid up between copper foil and pressed at 600 psi in a vacuum-assisted hydraulic press at temperature of 225° C. for 90 min. then cooled under pressure. This resulted in a copper laminate having dielectric constant of 19.0, and withstood a 30 sec. solder shock at 280° C. at an average ply thickness of 100 mm (0.0039"(3.9 mil)) dielectric laminate thickness.

EXAMPLE 2

A fine dispersion was prepared by mixing 386 g SiO$_2$ (HW-11-89, Harbison Walker Corp.) which was pretreated with phenyltrimethoxysilane (04330, Huls/Petrarch) into a manganese catalyzed solution of 200 g bismaleimide triazine resin (BT206OBJ, Mitsubishi Gas Chemical) and 388 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 min. then cooled under pressure. This resulting dielectric thus produced comprised of 53 weight percent SiO$_2$, 5 weight percent PTFE and 42 weight percent adhesive, displayed good adhesion to copper, dielectric constant (at 10 GHz) of 3.3 and dissipation factor (at 10 GHz) of 0.005.

EXAMPLE 3

A fine dispersion was prepared by mixing 483 g SiO$_2$ (HW-11-89) into a manganese-catalyzed solution of 274.7 g bismaleimide triazine resin (BT206OBJ, Mitsubishi Gas Chemical) and 485 g MEK. The dispersion was constantly agitated so as to insure uniformity. A swatch of 0.0002" thick expanded PTFE was then dipped into the resin mixture, removed, and then dried at 165° C. for 1 min. under tension to afford a flexible composite. Several plies of this prepreg were laid up between copper foil and pressed at 250 psi in a vacuum-assisted hydraulic press at temperature of 225° C. for 90 minutes then cooled under pressure. The resulting dielectric thus produced comprised of 57 weight percent SiO$_2$, 4 weight percent PTFE and 39 weight percent adhesive, displayed good adhesion to copper, dielectric constant (at 10 GHz) of 3.2 and dissipation factor (at 10 GHz) of 0.005.

EXAMPLE 4

A fine dispersion was prepared by mixing 15.44 kg TiO$_2$ powder (TI Pure R-900, DuPont Company) into a manganese-catalyzed solution of 3.30 kg bismaleimide triazine resin (BT206OBH, Mitsubishi Gas Chemical) and 15.38 kg MEK. The dispersion was constantly agitated so as to insure uniformity. A swatch of 0.0004" TiO$_2$-filled expanded PTFE (filled according to the teachings of Mortimer U.S. Pat. No. 4,985,296, except to 40% loading of TiO$_2$ and the membrane was not compressed at the end) was then dipped into the resin mixture, removed, and then dried at 165° C. for 1 min. under tension to afford a flexible composite. The partially cured adhesive composite thus produced comprised of 70 weight percent TiO$_2$, 9 weight percent PTFE and 21 weight percent adhesive. Several plies of this prepreg were laid up between copper foil and pressed at 500 psi in a vacuum-assisted hydraulic press at temperature of 220° C. for 90 minutes then cooled under pressure. This resulting dielectric displayed good adhesion to copper, dielectric constant of 10.0 and dissipation factor of 0.008.

EXAMPLE 5

A fine dispersion was prepared by mixing 7.35 kg SiO$_2$ (ADMATECHS SO-E2, Tatsumori LTD) with 7.35 kg MEK and 73.5 g of coupling agent, i.e., 3-glycidyloxypropyltrimethoxysilane (Dynasylan GLYMO (Petrach Systems). SO-E2 is described by the manufacture as having highly spherical silica having a particle diameter of 0.4 to 0.6 mm, a specific surface area of 4–8 m$^2$/g, a bulk density of 0.2–0.4 g/cc (loose).

To this dispersion was added 932 g of a 50% (w/w) solution of a cyanated phenolic resin, Primaset PT-30 (Lonza Corp.). In (MEK) methylethylketone, 896 g of a 50% (w/w) solution of RSL 1462 (Shell Resins, Inc.(CAS #25068-38-6)) in MEK, 380 g of a 50% (wlw) solution of BC-58 (Great Lakes, Inc.) in MEK, 54 g of 50% solution of bisphenol A (Aldrich Company) in MEK, 12.6 g Irganox 1010 (Ciba Geigy), 3.1 g of a 0.6% solution of Manganese 2-ethylhexanoate (Mn HEX-CEM (OMG Ltd.), and 2.40 kg MEK. This dispersion was subjected to ultrasonic agitation through a Misonics continuous flow cell for about 20 minutes at a rate of about 1–3 gal./minute. The fine dispersion thus obtained was further diluted to an overall bath concentration of 11.9% solids (w/w).

The fine dispersion was poured into an impregnation bath. A expanded polytetrafluoroethylene web having the node fibril structure of FIG. 4, and the following properties:

| Frazier | 20.55 |
|---|---|
| Coverage | 9 g/m$^2$ |
| Ball Burst | 3.2 lbs. |
| Thickness | 6.5 mil. |
| Mean Flow Pore Size | 9.0 microns |

The Frazier number relates to the air permeability of the material being assayed. Air permeability is measured by clamping the web in a gasketed fixture which is provided in circular area of approximately 6 square inches for air flow measurement. The upstream side was connected to a flow meter in line with a source of dry compressed air. The downstream side of the sample fixture was open to the atmosphere. Testing is accomplished by applying a pressure of 0.5 inches of water to the upstream side of the sample and recording the flow rate of the air passing through the in-line flowmeter (a ball-float rotameter that was connected to a flow meter.

The Ball Burst Strength is a test that measures the relative strength of samples by determining the maximum at break. The web is challenged with a 1 inch diameter ball while being clamped between two plates. The Chatillon, Force Gauge Ball/Burst Test was used. The media is placed taut in the measuring device and pressure affixed by raising the web into contact with the ball of the burst probe. Pressure at break is recorded.

The web described above was passed through a constantly agitated impregnation bath at a speed at or about 3 ft./min, so as to insure uniformity. The impregnated web is immediately passed through a heated oven to remove all or nearly all the solvent, and is collected on a roll.

Several plies of this prepeg were laid up between copper foil and pressed at 200 psi in a vacuum-assisted hydraulic press at temperature of 220° C. for 90 minutes and then cooled under pressure. This resulting dielectric displayed good adhesion to copper, dielectric constant (10 GHz) of 3.0 and dissipation factor of 0.0085 (10 GHz).

The physical properties of the particulate filler used in Example 4 and Example 7 are compared below.

| Property | Tatsumori (ADMATECHS) | Harbison Walker |
|---|---|---|
| Manufacture Technique | Vapor Metal Combustion | Amorphous Fused Silica |
| Designation | Silica SO-E2 | HW-11-89 |
| Median Particle Size | 0.5 micron | 5 micron |
| Shape | Spherical | Irregular, jagged |
| Surface Area | 6–10 m$^2$/g | 10 m$^2$/g |
| Bulk Density | 0.47 g/cc | 1.12 g/cc |
| Specific Density | 2.26 g/cc | 2.16 g/cc |

EXAMPLE 6

An ePTFE matrix containing an impregnated adhesive filler mixture, based on SiO$_2$ prepared from the vapor combustion of molten silicon is prepared as follows. Two precursor mixtures were initially prepared. One being in the form of a slurry containing a silane treated silica similar to that of Example 5 and the other an uncatalyzed blend of the resin and other components.

Mixture I

The silica slurry is a 50/50 blend of the SO-E2 silica of Example 5 in MEK, where the silica contains a coated of silane which is equal to 1% of the silica weight. To a five gallon container, 17.5 pounds of MEK and 79 grams of silane were added and the two components mixed to ensure uniform dispersion of the silane in the MEK. Then, 17.5 pounds of the silica of Example 5 were added. Two five gallon containers of the MEK-silica-silane mixture were added to a reaction vessel, and the contents, i.e., the slurry, was recirculated through an ultrasonic disperser for approximately one hour to break up any silica agglomerates that may be present. The sonication was completed and the contents of the reaction vessel were heated to approximately 80° C. for approximately one hour, while the contents were continuously mixed. The reacted mixture was then transferred into a ten gallon container.

Mixture II

The desired resin blend product is an MEK based mixture containing an uncatalyzed resin blend (the adhesive) contains approximately 60% solids, where the solid portion is an exact mixture of 41.2% PT-30 cyanated phenolic resin, 39.5% RSL 1462 epoxy resin, 16.7% BC58 flame retardant, 1.5% Irganox 1010 stabilizer, and 1% bisphenol A co-catalyst, all percentages by weight.

Into a ten gallon container, 14.8 pounds of PT-30 and 15–20 pounds of MEK were added and stirred vigorously to completely solvate the PT-30. Then 6 pounds of BC58 were measured and added to the MEK/PT-30 solution and vigorously agitated to solvate the BC58. The stabilizer, 244.5 grams of Irganox 1010 and bisphenol A, 163 grams were added. The ten gallon container was reweighed and 14.22 pounds of RSL 1462 were added. Additional MEK was added to bring the mixture weight to 60 pounds. The contents were then vigorously agitated for approximately 1 to 2 hours, or as long is necessary to completely dissolve the solid components.

The desired product is a mixture of the silica treated with a silane, the uncatalyzed resin blend, and MEK in which 68% by weight of the solids are silica, and the total solids are between 5% and 50% by weight of the mixture. The exact solids concentration varies from run to run, and depends in part on the membrane to be impregnated. The catalyst level is 10 ppm relative to the sum of the PT-30 and RSL1462.

The solid contents of mixtures I and II were determined to verify the accuracy of the precursors and compensate for any solvent flash that had occurred. Then mixture I was added to a ten gallon container to provide 12 pounds of solids, e.g., 515 solids content, 23.48 pounds of mixture I. Then mixture II was added to the container to provide 5.64 pounds of solids, e.g., 59.6% solids, 9.46 pounds of mixture II. the manganese catalyst solution (0.6% in mineral spirits), 3.45 grams, was added to the mixture of mixture I and mixture II and blended thoroughly to form a high solids content mixture.

The bath mixture for impregnating an ePTFE matrix, 28% solids mixture, was prepared by adding sufficient MEK to the high solids content mixture to a total weight of 63 pounds.

Thereafter, an ePTFE matrix was impregnated with this bath mixture to form a dielectric material.

EXAMPLE 7

A fine dispersion was prepared by mixing 26.8 grams Furnace Black (Special Schwarz 100, Degussa Corp., Ridgefield Park, N.J.) and 79 grams of coupling agent (Dynaslan GLYMO CAS #2530-83-8; 3-glycidyloxypropyl-trimethoxysilane (Petrach Systems). The dispersion was subjected to ultrasonic agitation for 1 minute, then added to a stirring dispersion of 17.5 pounds $SiO_2$ (SO-E2) in 17.5 pounds MEK which had previously been ultrasonically agitated. The final dispersion was heated with constant overhead mixing for 1 hour at reflux, then allowed to cool to room temperature.

Separately, an adhesive varnish was prepared by adding the following: 3413 grams of a 57.5% (w/w) mixture of Primaset PT-30 in MEK, 2456 grams of a 76.8% (w/w/) mixture of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mu HEX-CEM (OMG Ltd.) in mineral spirits, and 2.40 kg MEK.

In a separate container, 3739 grams of the dispersion described above was added, along with 0.0233 grams of Furnace Black (Special Schwarz 100, Degussa Corp., Ridgefield Park, N.J.), 1328 of the adhesive varnish described above and 38.3 pounds MEK. This mixture was poured into an impregnation bath, and an ePTFE web was passed through the impregnation bath at a speed at or about 3 ft/min. This dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperatures of 200° C. for 90 minutes then cooled under pressure. This resulting dielectric displayed good adhesion to copper.

EXAMPLE 8

An adhesive varnish was prepared by adding the following: 3413 grams of a 57.5% (w/w) solution of Primaset PT-30 (PMN P-88-1591)) in MEK, 2456 grams of a 76.8% (w/w) solution of RSL 1462 in MEK, 1495 grams of a 53.2% (w/w) solution of BC58 (Great Lakes, Inc.) in MEK, 200 grams of 23.9% (w/w) solution of bisphenol A (Aldrich Company) in MEK, 71.5 grams Irganox 1010, 3.21 grams of a 0.6% (w/w) solution of Mn HEX-CEM in mineral spirits, and 2.40 kg MEK.

In a separate container, 1328 grams of the adhesive varnish described above, 42.3 pounds MEK, 6.40 grams of Furnace Black (Special Schwarz 100, Degussa Corp., Ridgefield, N.J.) and 1860.9 grams $SiO_2$ (SO-E2). This mixture was poured into an impregnation bath, and an ePTFE web was passed through the impregnation bath at a speed at or about 3 ft/min. The dispersion was constantly agitated so as to insure uniformity. The impregnated web is immediately passed through a heated oven to remove all or nearly all the solvent, and is collected on a roll.

Several piles of this prepeg were laid up between copper foil and pressed at 200 psi in a vacuum-assisted hydraulic press at temperature of 220° C. for 90 minutes then cooled under pressure. This resulting dielectric displayed good adhesion to copper.

While particular embodiments of the present invention have been illustrated and described herein, the present invention should not be limited to such illustrations and descriptions. It should be apparent that changes and modifications may be incorporated and embodied as part of the present invention within the scope of the following claims.

What is claimed is:

1. A chip package comprising:
    an interconnect substrate having a coefficient of thermal expansion (CTE), a modulus of elasticity, first and second opposite surfaces, peripheral edges, and a central chip mounting area on the first surface;
    an adhesive layer; and
    a substantially planar constraining ring having a CTE, a modulus of elasticity, first and second opposite surfaces, outer peripheral edges and a central opening, the substantially planar constraining ring being a laminate having at least one conductive layer and at least one dielectric layer, and
    wherein the first surface of the substantially planar constraining ring is bonded, by the adhesive layer, to the first surface of the interconnect substrate such that the central opening of the substantially planar constraining ring is positioned over said central chip mounting area of the first surface of the interconnect substrate, and
    wherein the CTE of the interconnect substrate is within +/−20% of the CTE of the substantially planar constraining ring and the modulus of elasticity of the interconnect substrate differs from the modulus of elasticity of the substantially planar constraining ring.

2. A chip package according to claim 1, further comprising a lid bonded to the second surface of the substantially planar constraining ring.

3. A chip package according to claim 1, wherein the at least one conductive layer is copper.

4. A chip package according to claim 1, wherein the at least one dielectric layer is an ePTFE matrix impregnated with cyanate ester and epoxy.

5. A chip package according to claim 1, wherein the at least one conductive layer is made of a material selected from the group consisting of copper, aluminum, nickel, molybdenum, titanium, and stainless steel.

6. A chip package according to claim 1, wherein the substantially planar constraining ring includes an aluminum/silicon carbide composite.

7. A chip package according to claim 1, wherein the at least one dielectric layer is made of a glass filled epoxy.

8. A chip package according to claim 1, wherein the substantially planar constraining ring is made at least in part of a ceramic material selected from the group consisting of silicon carbide, silicon dioxide, alumina, cordierite, and aluminum nitride.

9. A chip package according to claim 1, wherein the substantially planar constraining ring includes a thermally conductive material, thereby providing a heat sink for dissipating heat from the interconnect substrate.

10. A chip package comprising:
    an interconnect substrate having a coefficient of thermal expansion (CTE), first and second opposite surfaces, peripheral edges, and a central chip mounting area on the first surface;
    an adhesive layer; and
    a substantially planar constraining ring having a CTE, first and second opposite surfaces, outer periDheral edges and a central opening, the substantially planar constraining ring being a laminate having at least one conductive layer and at least one dielectric layer, the substantially planar constraining ring including at least one feature selected from the group consisting of a capacitor and a resistor,
    wherein the first surface of the substantially planar constraining ring is bonded, by the adhesive layer, to the first surface of the interconnect substrate such that the central opening of the substantially planar constraining ring is positioned over said central chip mounting area of the first surface of the interconnect substrate, and wherein the CTE of the interconnect substrate is within +/−20% of the CTE of the substantially planar constraining ring.

11. A chip package according to claim 10, wherein the substantially planar constraining ring includes at least one capacitor, the capacitor including a first conductive layer formed on at least a portion of the second surface of the substantially planar constraining ring, a first dielectric layer formed on at least a portion of the first conductive layer, a second conductive layer formed on at least a portion of the first dielectric layer, and a second dielectric layer formed on the second conductive layer, the first and second conductive layers forming electrodes of the capacitor.

12. A chip package according to claim 10, wherein the substantially planar constraining ring includes at least one capacitor, the capacitor including a first dielectric layer formed on the second surface of the substantially planar constraining ring, a first conductive layer formed on at least a portion of the first dielectric layer, a second dielectric layer formed on at least a portion of the first conductive layer, a second conductive layer formed on at least a portion of the second dielectric layer, and a third dielectric layer formed on at least a portion of the second conductive layer, the first and second conductive layers forming electrodes of the capacitor.

13. A chip package according to claim 12 wherein the substantially planar constraining ring further includes a resistor, wherein the resistor includes a resistive layer made of a material having a desired resistance characteristic and being formed on a surface of the third dielectric layer.

14. chip package according to claim 10, wherein the substantially planar constraining ring includes at least one resistor.

15. A chip package according to claim 10, wherein the first surface of the substantially planar constraining ring is electrically conductive, and wherein the at least one dielectric layer is formed on the first surface of the substantially planar constraining ring, the at least one conductive layer being formed on the first dielectric layer, the first surface of the substantially planar constraining ring and the first conductive layer forming electrodes of a capacitor.

16. A chip package according to claim 15, wherein the first surface of the interconnect substrate includes a plurality of terminal pads and the adhesive layer is anisotropic with respect to conductivity, whereby the electrodes of the capacitor are electrically coupled to the terminal pads through the adhesive.

17. A chip package according to claim 13, wherein the second surface of the substantially planar constraining ring is electrically conductive, and the substantially planar constraining ring further includes a first dielectric layer formed on said second surface, a first conductive layer formed on at least a portion of the first dielectric layer, and a second dielectric layer formed on at least a portion of the first conductive layer, the second surface of the constraining ring and the first conductive layer forming electrodes of a capacitor.

* * * * *